(12) United States Patent
Le Gallo et al.

(10) Patent No.: US 7,122,915 B2
(45) Date of Patent: Oct. 17, 2006

(54) CONTROL FOR A MOTOR VEHICLE

(75) Inventors: Yann Le Gallo, Orleans (FR);
Sebastien Lac, Orleans (FR);
Dominique Benoit, St. Jean le Blanc (FR); Mickael Lebourgeois, Auvilliers en Gatinais (FR)

(73) Assignee: ArvinMeritor Light Vehicle Systems-France, Sully-sur-Loire (FR)

( * ) Notice: Subject to any disclaimer, the term of this patent is extended or adjusted under 35 U.S.C. 154(b) by 426 days.

(21) Appl. No.: 10/672,286

(22) Filed: Sep. 26, 2003

(65) Prior Publication Data

US 2004/0119613 A1    Jun. 24, 2004

(30) Foreign Application Priority Data

Sep. 26, 2002    (FR) .................................. 02 11928

(51) Int. Cl.
*B60L 1/00*    (2006.01)
(52) U.S. Cl. ....................................... 307/9.1
(58) Field of Classification Search ................. 307/9.1
See application file for complete search history.

(56) References Cited

U.S. PATENT DOCUMENTS

| 4,562,315 A | 12/1985 | Aufderheide |
| 4,954,823 A | 9/1990 | Binstead |
| 5,805,402 A | 9/1998 | Maue et al. |
| 6,354,653 B1 | 3/2002 | Seeberger et al. |
| 6,427,540 B1 * | 8/2002 | Monroe et al. ............... 73/753 |

FOREIGN PATENT DOCUMENTS

| DE | 43 13 030 | 10/1993 |
| DE | 298 10 421 | 10/1998 |
| WO | WO 01/15186 | 3/2001 |

OTHER PUBLICATIONS

French Search Report dated Jun. 20, 2003.

* cited by examiner

*Primary Examiner*—Robert L. Deberadinis
(74) *Attorney, Agent, or Firm*—Carlson, Gaskey & Olds

(57) ABSTRACT

A control for a window lifter of a motor vehicle includes a sensor in the form of a physical matrix having a pressure sensitive surface. The control also includes keys that define a pressure point. When pressed, the keys influence the pressure sensitive surface. The keys can be fixed to the sensor or can be connected to a support against which the sensor is fixed. The control can easily be reconfigured for different keys without modifying the sensor.

15 Claims, 1 Drawing Sheet

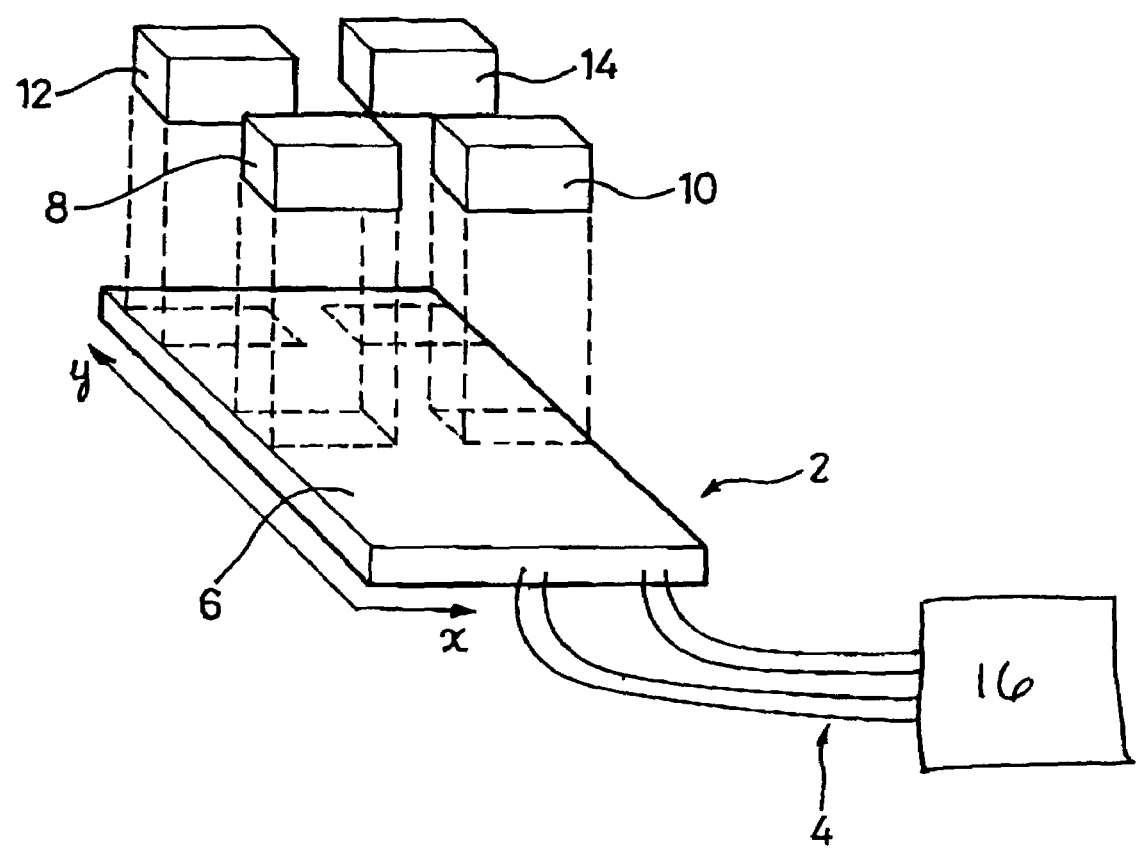

CONTROL FOR A MOTOR VEHICLE

REFERENCE TO RELATED APPLICATIONS

This patent application claims priority to French Patent Application No. FR 02 11 928 filed on Sep. 26, 2002.

TECHNICAL FIELD

The present invention relates generally to a control used in a motor vehicle that allows passengers to operate vehicle equipment, such as window lifters or locks.

BACKGROUND OF THE INVENTION

Audi® markets a vehicle known as the A4 that includes a driver's front door having a central locking passenger control, a passenger control for operating the window lifter of the passenger door, and passenger controls for operating the window lifters of the rear doors. The rear doors also have a passenger control for operating the window lifters of the rear doors. The numerous passenger controls in this vehicle demonstrate the diversity of controls desired by motor vehicle manufacturers. That is, a driver's door may easily have up to six separate controls.

DE-U-298 10 421 discloses a passenger control for a window lifter including a plurality of sensors arranged in a line. The sensors can be pressure sensors, which are known in the field of computing as "touchpads," or photosensitive sensors. The position of the window is controlled based on which of sensors is influenced.

DE-A-43 13 030 discloses a passenger control formed of a switch mounted on a printed circuit. The switch is influenced through an elastic "skin" of polyurethane. A rigid button can be inserted into the elastic skin.

U.S. Pat. No. U.S.-A-5,805,402 discloses an integrated assembly with various actuating controls. Actuating buttons are mounted in openings, and flexible printed circuit exhibiting tracks are located underneath the buttons. Pressure applied on the buttons causes contact between the tracks of the printed circuit.

PCT publication WO-A-01/15186 discloses a passenger switch for a motor vehicle. A breaker mounted on a printed circuit is surmounted by a mechanical element. The passenger acts on the mechanical element to actuate the switch and influence the breaker. In another example, the printed circuit has conducting pads that are connected by metalized regions under the mechanical elements.

Another example of a control is disclosed in U.S. Pat. No. 6,354,653 which discloses a control having switches influenced through the door interior lining.

Hence, there is a need in the art for a device that provides a diverse passenger control that can be tailored to the requirements of manufacturers while at the same time reducing the diversity of the parts.

SUMMARY OF THE INVENTION

A manual control for a motor vehicle includes a sensor in the form of a physical matrix having a pressure sensitive surface. The sensor has at least one key that acts upon the pressure sensitive surface when manually pressed. In one embodiment, the keys are fixed to the sensor. The keys can also be formed in a support against which the sensor is fixed.

The sensor provides a signal that is a function of the position of a point of influence applied to the pressure sensitive surface. The signal may be supplied on one or two wires. Preferably, the keys are compressible.

The control can be employed in a window lifter including a geared motor controlled by the control. The passenger controls can be configured in a simple and purely software manner to suit the vehicle requirements.

Other features and advantages of the invention will become apparent on reading the detailed description which follows of some embodiments of the invention, given by way of example only and with reference to the single figure.

BRIEF DESCRIPTION OF THE DRAWING

FIG. 1 illustrates a schematic perspective view of the control of one embodiment of the present invention.

DETAILED DESCRIPTION OF THE PREFERRED EMBODIMENT

FIG. 1 is a schematic perspective view of the control of the present invention. The control includes a touch sensor or pressure sensitive base 2 in the form of a physical matrix. In one example, the base 2 typically has four connecting wires 4 or four terminals for connecting the wires 4. Although only four wires 4 or terminals have been illustrated and described, it is to be understood that any number of wires or terminals can be used. Two of the wires 4 provide power and two of the wires 4 emit the signals, as explained below. Although the base 2 is illustrated as rectangular, it is to be understood that other shapes are possible.

The term "a physical matrix" means that the pressure sensitive base 2 can supply an electrical signal based on the location of any pressure applied to the upper surface 6 of the base 2, while allow fewer connecting wires than detectable positions. In one example, the base 2 is a pressure or contact sensor.

The base 2 supplies an indication of the position of the point of influence on the control in the x and y directions. The corresponding signals are emitted by the base 2 over two wires 4. One wire corresponds to the position along the x-axis, and the other wire corresponds to the position along the y-axis. The signals corresponding to the two positions can also be transmitted over one wire. These directions are defined by the edges of the rectangular base 2. However, it is to be understood that the direction or directions for identifying the point of influence are independent of the shape of the base 2.

One pressure sensitive base 2 that may be used in this invention is marketed by Densitron under the reference DTS407-0041. Resistive or capacitive tile technology, which both incorporate temperature sensitive components, can be used. It is also possible to use contact technology with a polyester film and metal contacts. Pressure applied on the physical matrix creates a local contact, providing a physical matrix that is not temperature sensitive.

The control also includes actuating keys or buttons 8, 10, 12 and 14. In one example, there are four keys 8, 10, 12 and 14 that allow the functions of the window lifter to be fulfilled. Preferably, the keys 8, 10, 12 and 14 are compressible to protect the base 2 against excessive pressure allied by the user. The window can be continuously raised by providing pressure on the key that triggers the raising of the window to the closed position. The window can be continuously lowered by providing pressure on the key that triggers the lowering of the window to the open position. The window can be intermittently raised by providing pressure on the key that triggers the raising of the window, and the window continues to rise as long as pressure is applied on the key. Finally, the window can be intermittently lowered by providing pressure on the key that triggers the lowering of the window, and the window continues to be lowered as long as pressure is applied on the key. Other keys, such as the locking keys mentioned in the example of the Audi A4, can also be provided on the base 2.

The keys 8, 10, 12 and 14 define both the configuration of the control and the location where the user presses for a given control. The base 2 itself is not partitioned according to conform to the keys 8, 10, 12 and 14 that are supplied in the control. Therefore, the same base 2 can be used regardless of the number and position of keys, allowing the number and position of the keys 8, 10, 12 and 14 to be changed depending on customer requirements. If the number or position of the keys 8, 10, 12 and 14 is to be changed, a computer 16 is programmed based on the desired changes to change the signals supplied by the base 2 on the connection wires 4. This is advantageous because identical bases 2 can be used for different control configurations, reducing the number of parts needed for the various functions.

The number of connections is also limited. The control of the present invention includes only two wires, (apart from the power supply wires) rather than two wires per key as used in the prior art. The control is also thin, making the control easier to integrate.

In the prior art, different printed circuits are developed for different control configurations (that is, for different sets of keys 8, 10, 12 and 14), increasing the development times and the possible mounting errors. Costs are also increased because various control parts need to be stocked.

Unlike the set of sensors described in DE-U-298 10 421, the base 2 of the present invention is in the form of a physical matrix and is not directly influenced by the user. The keys 8, 10, 12 and 14 define where the user should press, protecting the base 2 and allowing the base 2 to be easily used with different controls. Furthermore, the invention preserves the use of mechanical keys or buttons, maintaining the customary feel of current control structures.

The keys 8, 10, 12 and 14 may be fixed to the base 2 to facilitate mounting and arrangement of the control on a support (not shown). The support can include holes that provide access to the keys 8, 10, 12 and 14. It is also possible to use a flexible support through which the user presses on the keys 8, 10, 12 and 14. In this embodiment, the position of the keys 8, 10, 12 and 14 is defined during assembly of the control in the factory, and there is no risk of variation upon mounting into the vehicle.

The keys 8, 10, 12 and 14 may also be formed in the support of the base 2, or integrated into one unit. The base 2 is fixed to the support near the keys 8, 10, 12 and 14 during assembly. This simplifies the manufacture of the control and offers greater freedom in design of the keys 8, 10, 12 and 14 to influence the pressure sensitive surface 6 of the base 2. The present invention also simplifies the sealing of the control. A film can be provided between the keys 8, 10, 12 and 14 and the base 2 to protect the base 2.

It will be understood that the control provides the customer (the motor vehicle manufacturer) with various options in the nature and position of the keys. The keys can be for example, foam, conventional buttons with a foam underside, a flexible plastic film with a boss, or a combination of plastic films. Any kind of symbol may be provided on the keys. For example, the symbol can be a pictogram printed onto the plastic film.

When a user presses on one of the keys 8, 10, 12 and 14, the pressure sensitive base 2 emits a signal on the connecting wires 4. The signal is a function of the key or keys 8, 10, 12 and 14 pressed by the user and is transmitted to a processing circuit (not shown). Depending on the nature of the signal received, the processing signal emits operating commands. In the example of a motor vehicle door and a window lifter control, the processing signal may be a local circuit dedicated to controlling the window lifter. If the control is a more complex control that provides the functions of locking or unlocking a lock or raising or lowering the windows of other doors, then the control circuit may be incorporated into the door multiplexer.

Of course, the present invention is not restricted to the embodiments described by way of the example. Although a door controls has been described, it is to be understood the control can be used in more general applications other than the doors of motor vehicles. For example, the controls could be used with a vehicle sunroof.

The foregoing description is only exemplary of the principles of the invention. Many modifications and variations of the present invention are possible in light of the above teachings. The preferred embodiments of this invention have been disclosed, however, so that one of ordinary skill in the art would recognize that certain modifications would come within the scope of this invention. It is, therefore, to be understood that within the scope of the appended claims, the invention may be practiced otherwise than as specifically described. For that reason the following claims should be studied to determine the true scope and content of this invention.

What is claimed is:

1. A control comprising:
    a sensor including a base exhibiting a pressure sensitive surface; and
    at least one key defining a pressure point,
    wherein the pressure sensitive surface supplies an electrical signal which is specific to a location of the pressure point, and
    wherein the at least one key defines both a configuration of the control and a location on the pressure sensitive surface for a given control when pressure is applied to the pressure point.

2. The control of claim 1 wherein the at least one key is fixed to the sensor.

3. The control of claim 1 further including a support, wherein the at least one key and the support are integrated as one piece.

4. The control of claim 3 wherein the sensor is fixed to the support.

5. The control of claim 1 wherein the electrical signal corresponds to the location of the pressure point.

6. The control of claim 5 wherein the electrical signal is supplied by at least one wire.

7. The control of claim 1 further including a first wire pair that provides power to the sensor and a second wire pair that carries the electrical signal from the sensor.

8. The control of claim 1 wherein the sensor is substantially rectangular.

9. The control of claim 1 wherein the at least one key includes a first key to continuously raise a window, a second key to continuously lower the window, a third key to intermittently raise the window, and a fourth key to intermittently lower the window.

10. The control of claim 1 wherein the at least one key is compressible relative to the base.

11. The control of claim 1 further including a film between the at least one key and the base.

12. A window lifter comprising:
a geared motor controlled by a control including:
a sensor including a base exhibiting a pressure sensitive surface, and
at least one key defining a pressure point, wherein the pressure sensitive surface supplies an electrical signal which is specific to a location of the pressure point, and
wherein the at least one key defines both a configuration of the control and a location on the pressure sensitive surface for a given control when pressure is applied to the pressure point.

13. A method of manually controlling a vehicle component with a control, the method comprising the steps of:
defining a pressure point with at least one key;
acting the at least one key on a pressure sensitive surface of a sensor, wherein the sensor includes a base exhibiting the pressure sensitive surface;
supplying an electrical signal which is specific to a location of the pressure point;
defining both a configuration of the control and a location on the pressure sensitive surface for a given control when pressure is applied to the pressure point; and
controlling the vehicle component.

14. The method of claim 13 wherein the vehicle component is a geared motor of a window lifter.

15. The method of claim 13 wherein the at least one key performs the step of defining both the configuration of the control and the location of the pressure sensitive surface.

* * * * *